United States Patent [19]
Coffinberry

[11] Patent Number: 6,156,439
[45] Date of Patent: Dec. 5, 2000

[54] COATING FOR PREVENTING FORMATION OF DEPOSITS ON SURFACES CONTACTING HYDROCARBON FLUIDS AND METHOD THEREFOR

[75] Inventor: George A. Coffinberry, West Chester, Ohio

[73] Assignee: General Electric Company, Cincinnati, Ohio

[21] Appl. No.: 08/955,043

[22] Filed: Oct. 21, 1997

Related U.S. Application Data

[60] Provisional application No. 60/029,082, Oct. 23, 1997.

[51] Int. Cl.$^7$ ..................................................... B32B 17/00
[52] U.S. Cl. ........................ 428/469; 428/472; 428/408; 428/688; 427/327; 427/375
[58] Field of Search ................................... 428/469, 472, 428/408, 688; 427/327, 375

[56] References Cited

U.S. PATENT DOCUMENTS

| | | | |
|---|---|---|---|
| 2,698,512 | 1/1955 | Schirmer et al. | 60/209 |
| 2,959,915 | 11/1960 | Dille et al. | 60/209 |
| 3,173,247 | 3/1965 | Smith et al. | 60/206 |
| 4,078,604 | 3/1978 | Christl et al. | 60/267 |
| 4,297,150 | 10/1981 | Foster . | |
| 4,343,658 | 8/1982 | Baker . | |
| 4,444,732 | 4/1984 | Konoki . | |
| 5,240,741 | 8/1993 | Edwards, III et al. | 427/180 |
| 5,264,244 | 11/1993 | Edwards, III | 427/226 |
| 5,266,360 | 11/1993 | Edwards, III | 427/397 |
| 5,269,137 | 12/1993 | Edwards, III | 60/261 |
| 5,324,544 | 6/1994 | Spence et al. | 427/397 |
| 5,336,560 | 8/1994 | Spence et al. | 428/336 |
| 5,360,531 | 11/1994 | Tong . | |
| 5,567,305 | 10/1996 | Jo . | |
| 5,805,973 | 9/1998 | Coffinberry | 428/551 |

*Primary Examiner*—Timothy M. Speer
*Attorney, Agent, or Firm*—Andrew C. Hess; David L. Narciso

[57] ABSTRACT

A coating and method for reducing the tendency for coke and gum deposits of hydrocarbon fluids to form and adhere to a surface at an elevated temperature. The coating enhances surface flow conditions along the surface so as to reduce both surface reaction time and concentration of deposit precursors (radicals and atoms) that provide for polymer growth. The coating has a smooth surface that is free of microscopic pits and scratches, and preferably has a surface roughness not greater than about 16 microinches (about 4 micrometers) $R_a$. The coating is also preferably resistant to chemical attack from contaminants in the fluid, and inhibits diffusion between the fluid and surface. In addition, the coating has a low surface wettability to hydrocarbons, meaning that the tendency for hydrogen in the fuel to bond with atoms at the coating surface (chemisorption) is reduced or eliminated. In one embodiment, a smooth and preferably amorphous coating of metal oxides is deposited by a chemical vapor deposition (CVD) process on a smooth and essentially oxide-free surface, followed by a layer of metal atoms or metal-metal compounds that exhibit low affinity for chemisorption. In a second embodiment, chemisorption is avoided by forming the coating such that potentially electronegative atoms in the coating are tied-up with other strong chemical bonds.

25 Claims, 1 Drawing Sheet

COATING FOR PREVENTING FORMATION OF DEPOSITS ON SURFACES CONTACTING HYDROCARBON FLUIDS AND METHOD THEREFOR

CROSS REFERENCE TO RELATED APPLICATIONS

This application claims the benefit of U.S. Provisional Application No. 60/029,082, filed Oct. 23, 1997.

FIELD OF THE INVENTION

The present invention relates to coating systems for preventing the formation of deposits on surfaces that contact hydrocarbon fluids. More particularly, this invention relates to a method of preventing or reducing the deposition of thermal decomposition products on surfaces in contact with a hydrocarbon fluid, and to a fluid containment article having a coating that inhibits the formation and adhesion of thermal decomposition products of hydrocarbon fluids.

BACKGROUND OF THE INVENTION

Thermal instability, or in the case of fuels, fuel instability, generally refers to the formation of undesired deposits that occurs when hydrocarbon fluids, such as fuels, are subjected to high temperatures. In the case of fuels, it is generally accepted that there are two distinct mechanisms occurring within two overlapping temperature ranges. In the first mechanism, referred to as the coking process, a generally consistent increase in the rate of formation of coke deposits occurs up to about 1200° F. (about 650° C.). Coke formation is the result of high levels of hydrocarbon pyrolysis, and eventually limits the usefulness of the fuel. A second lower temperature mechanism generally peaks at about 700° F. (about 370° C.) and involves the formation of gum deposits. This second mechanism involves oxidation reactions that lead to polymerization which includes the formation of gums. Both coke and gum formation and deposits can occur simultaneously at temperatures where the above ranges overlap.

In the past, the solution to the problem of gum and coke formation was primarily directed toward placing limitations on fuel chemistry and impurities associated with fuels, as disclosed in U.S. Pat. Nos. 2,698,512, 2,959,915 and 3,173,247, which are incorporated herein by reference. However, even with the most elaborate special treatment of a fuel, coke formation cannot be entirely eliminated because, regardless of the purity of the hydrocarbon used, coke formation will occur if sufficient temperatures and durations are sustained. On the other hand, the chemistry of a hydrocarbon fluid and the chemistry of a vessel used to contain the fluid can have a major influence on deposit mechanisms and deposit rates at the temperatures where it is most desirable to use the fluid. In the lower temperature region where gum formation occurs, oxygen from air dissolved in the liquid is the major adverse ingredient. Boiling may amplify this adversity because of the oxygen concentration effect of gas bubbles adjacent to hot walls. If oxygen or air is absent, gum formation is not likely to occur.

In much of the prior art, the problems associated with gum and coke thermal deposits have been predominately dealt with by focusing on bulk fluid chemistry and reactions which can take place within the fluid. These investigations have involved a wide range of hydrocarbon compositions and the presence of numerous impurities such as sulfur compounds, nitrogen compounds, oxygen and trace metals.

It has been observed that deposits attached to containment walls often contain very large quantities of sulfur and nitrogen compounds or intermediates thereof, in addition to gums and cokes. The prior art also discloses that some form of reaction takes place between the fuel and the wall. In U.S. Pat. No. 4,078,604, which is incorporated herein by reference, heat exchangers are characterized by thin-walled corrosion-resistant layers of electrodeposited gold or similar corrosion-resistant metals on the walls of the cooling channels in order to make the surfaces corrosion resistant to such storable liquid fuels as red fuming nitric acid. In this case, the wall is protected from corrosion, and the intent is not to prevent deposit formations. It is also known from the prior art that gold plating has been used to prevent surface catalytic reactions with fuel, in which case the objective is not to interfere with gum formation for the purpose of evaluating fuel chemical stability.

Thermal instability and fuel instability are becoming more significant with developing technology, and will become even more significant as processes and machinery are required to operate at higher temperatures as afforded by advances in materials technology and as the chemical quality of hydrocarbons for fuels, oils, lubricants, petrochemical processes (plastics and synthetics) and the like, decreases. Furthermore, hydrocarbon fluids, fuels and oils derived from non-petroleum sources, such as shale and coal, will have significantly more problems with thermal instability because of their high content of olefins, sulfur and other compounds. Accordingly, fluid containment articles that are resistant to or prevent the formation of adverse decomposition products and foulants are highly desirable in applications where thermal instability, including fuel instability, is a problem as a result of exposure to such fluids to high temperatures.

Articles and coatings having the above attributes are disclosed in U.S. Pat. Nos. 5,805,973 and 5,891,584, assigned to the assignee of the present invention, and incorporated herein by reference. These patents disclose the use of coatings that eliminate or reduce the surface reactions which lead to formation of thermal instability deposits from hydrocarbon fluids, and further eliminate or reduce adhesion of such deposits. These patents generally prevent the deposit on a metal surface of hydrocarbon degradation products derived from sulfur-containing hydrocarbon fluid by processing the metal surface to be clean and oxide-free, and then depositing a coating comprising a smooth catalytic layer of zirconium oxide and/or a diffusion barrier layer of a non-catalytic metal oxide, amorphous glass or mixtures thereof. The catalytic and non-catalytic layers are deposited by chemical vapor deposition from an undiluted organometallic precursor vapor. According to these inventions, the catalytic layer catalyzes thermal decomposition in the hydrocarbon fluid to promote the formation of coke, which is substantially non-adherent to the coating, while the non-catalytic diffusion barrier layer is inert to thermal decomposition in the hydrocarbon fluid and therefore inhibits the formation of gum, sulfur compounds and other decomposition impurities in the fluid.

While such coatings have been proven to be extremely effect, further reductions in the formation of gum and coke deposits on articles that must contain hydrocarbon fluids at high temperatures would be desirable.

SUMMARY OF THE INVENTION

According to the present invention, there is provided a coating and method for reducing the tendency for coke and gum deposits of hydrocarbon fluids (e.g., fuels) to form and adhere to surfaces that contact such fluids at elevated temperatures. According to the invention, long surface kinetic residence times between hydrocarbon fuels and metal surfaces are the primary cause of coke and gum deposits. Such a mechanism is not based on knowledge of the chemistry of the fuel nor the chemistry of the deposit, nor is it concerned with reaction mechanisms, whether catalytic or not. Instead, the focus of the present invention is that the formation of hydrocarbon deposits involves a molecular growth process which is dependent on time-at-temperature and the availability of deposit-forming chemical species. With this view, formation of deposits cannot be entirely avoided under static conditions, as occurs during thermal soak-back of fuel injectors in jet and gas turbine engines. However, the present invention advantageously provides coatings that enable such statically-formed deposits to be more easily removed without the need for high temperature decarbonization.

The method of this invention generally entails a coating that enhances surface flow conditions along a metal surface such that the bulk fluid has minimum time to react on the surface and such that the boundary layer at the surface is well mixed with the bulk fluid, reducing both surface reaction time and concentration of deposit precursors (radicals and atoms) which provide for gum (polymer) growth. Such a coating has a smooth surface that is free of microscopic pits and scratches that would otherwise provide not only mechanical anchoring points for swelling deposit polymers, but also "reaction pools" that promote longer reaction times and the availability of reaction species. For this purpose, the coating preferably has a surface roughness not greater than about 16 microinches (about 4 micrometers) $R_a$. The smooth surface of the coating is also preferably resistant to chemical attack from contaminants in the fuel such as sulfur and water which form sulfuric acid and pit the surface. Finally, the coating of this invention has a low wettability surface, enabling the fuel to rapidly pass over the coating.

According to the invention, a suitable coating having the above characteristics is a smooth diffusion barrier layer that has been deposited on a smooth and essentially oxide-free surface, i.e., a surface substantially free of oxides formed in situ on the surface by oxidation of the surface. Furthermore, the coating is characterized by having low surface wettability to hydrocarbons, which as used herein means that the tendency for hydrogen in the fuel to chemically attract atoms at the coating surface is reduced or eliminated. This type of bonding, called chemisorption (chemical absorption) or hydrogen-bonding, is very strong. A low wettability surface of the type required by this invention evolves only physisorption via weak polar (van der Waals) forces.

In one embodiment of the invention, a smooth and preferably amorphous layer of metal oxides is deposited by a chemical vapor deposition (CVD) process on a smooth and essentially oxide-free surface. On this layer, a second layer is deposited that contains metal atoms or metal-metal compounds that exhibit low affinity for chemisorption due to being more electropositive than most other elements. Accordingly, preferred metals are those that appear on the left side of the periodic table, e.g., the Group IA metals: lithium, sodium, potassium, rubidium and francium. Suitably effective metal atoms and metal compounds also include metals that are less electropositive than the Group IA metals, such as aluminum and gold. These metals logically make poor catalysts for petroleum processing because they have low affinity for hydrogen. See P. W. Atkins, *Physical Chemistry* (1986) p. 784–785. A preferred method for forming the coating of this embodiment is to deposit the low-wettability pure metal or metal-metal compound layer by CVD over a metal oxide CVD sub-coat.

In a second embodiment of the invention, chemisorption is avoided by providing a coating in which potentially electronegative atoms in the coating are tied-up with other strong chemical bonds. For example, a coating that contains fluorine or another halogen element (and would therefore readily bond with hydrogen) further includes one or more elements that tie-up the fluorine atoms, e.g., carbon atoms that form stable symmetrical bonds with fluorine atoms, so that hydrogen cannot find a chemisorption anchoring point. Preferred coatings include "diamond-like" carbon compositions characterized by carbon-carbon covalent bonds, carbon atom symmetry, and surface atoms which at worst provide double carbon bonds in competition with hydrogen bonding or preexisting carbon-hydrogen bonds in the surface. As with the first embodiment, the coating of the second embodiment is preferably deposited by CVD on a smooth, essentially oxide-free surface of the wall in order to yield a sufficiently smooth coating surface.

From the above, it can be seen that coating systems within the scope of this invention, whether a single layer or formed of multiple layers, are required to prevent or reduce hydrocarbon fluid deposits by having a suitably smooth surface to minimize surface reaction times, being resistant to chemical attack from contaminants in the fuel, and exhibit low wettability in order to exhibit the desired lack of chemisorption discussed above. According to this invention, such coatings considerably reduce the tendency for coke and gum deposits of hydrocarbon fluids (e.g., fuels) to form and adhere to heated surfaces under dynamic flow conditions, and enable deposits formed under static conditions to be easily removed without the need for high temperature decarbonization.

Other objects and advantages of this invention will be better appreciated from the following detailed description.

DETAILED DESCRIPTION OF THE INVENTION

Figure 1:
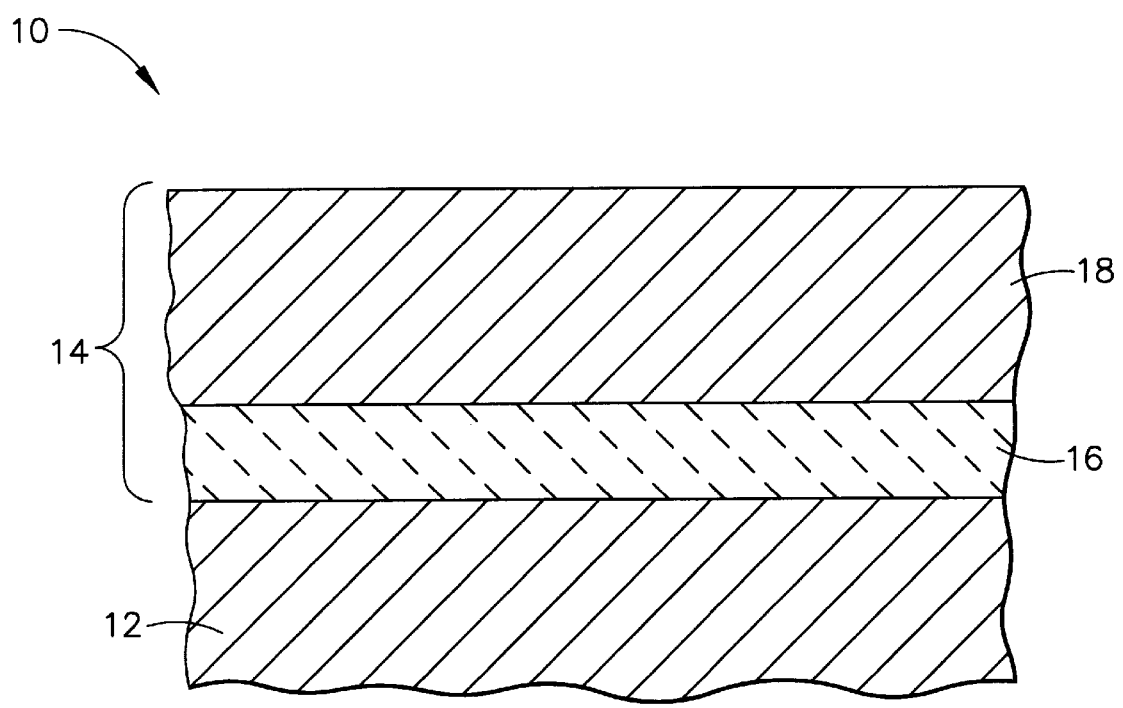
FIG. 1 represents a cross-sectional view of a containment wall having a coating in accordance with this invention.

The present invention is directed to surfaces that contact a hydrocarbon fluid (e.g., fuels) at elevated temperatures, and the reduction or prevention of coke and gum deposits of hydrocarbon fluids that would otherwise form and adhere to such surfaces when maintained at elevated temperatures, e.g., up to about 1200° F. According to this invention, the formation and adhesion of such deposits are considerably reduced by reducing the surface kinetic residence time of a hydrocarbon fluid at the surface. The invention has applicability to any hydrocarbon fluid in which gum (or other polymers) and coke form when the fluid is subjected to elevated temperatures. Such fluids may be pure hydrocarbon or mixtures thereof. Fluid containment articles that can benefit from the present invention may be any component which is adapted to contain or transport hot hydrocarbon fluid, and include but are not limited to conduits and heat exchangers. Examples of such fluid containment articles are those with surfaces through which heat is transferred from a heat source to a liquid hydrocarbon fluid, as may occur with fuel storage tanks, conduits for transporting liquid fuel, coils and other devices for heat exchange contact with fuel, fuel injector surfaces and the like.

FIG. 1 represents a wall 12 of a fluid containment article 10 for purposes of illustrating this invention. A liquid hydrocarbon fuel contacts and flows across the surface of the wall 12, such that heat transferred from a heat source (not shown) is conducted through the wall 12 and then transferred to the fuel, such that the wall 12 is cooled by the fuel. The wall 12 may generally be constructed of any suitable material for the particular application. Typical materials include stainless steel, corrosion-resistant alloys of nickel and chromium, and high-strength nickel-base alloys. Notably, alloys such as these that contain iron, chromium and nickel appear to cause or promote the formation of fuel thermal decomposition products such as gum and coke in liquid hydrocarbon fluids and fuels.

As shown, the wall 12 is protected by a coating 14 that, in accordance with this invention, reduces or prevents the formation and adhesion of gum and coke deposits from the fuel that tend to occur as a result of the elevated temperatures of the wall 12 and fuel. Accordingly, the coating 14 and not the wall 12 is intended to contact the hydrocarbon fuel. Preferably, the coating 14 is continuous and completely covers all surfaces of the wall 12 that would otherwise contact the fuel. As will be discussed below, the coating 14 of this invention may be formed by a single layer (generally identified by reference number 14) or two or more discrete layers, such as layers 16 and 18 shown in FIG. 1.

In accordance with the present invention, the coating 14 is smooth, protective and exhibits low wettability toward the hydrocarbon contained by the wall 12. As used herein, the term "smooth" is defined as the absence of microscopic pits and scratches that would otherwise provide not only mechanical anchoring points for deposits, but also "reaction pools" that promote longer reaction times and the availability of reaction species. A preferred surface roughness for the coating 14 is about 16 microinches (about 4 micrometers) $R_a$ or less. This function of the coating 14 relies in part on the flow conditions of the hydrocarbon fluid, in which ideal conditions are where the bulk fluid has minimum time to react at the coating surface and the fluid boundary layer at the coating surface is well mixed with the bulk fluid, reducing both surface reaction time and concentration of deposit precursors (radicals and atoms) that provide for polymer growth. Accordingly, surface irregularities that would form fluid recirculation zones that act as reaction pools are to be avoided.

Also as used herein, the term "protective" is defined to mean that the coating 14 protects the wall 12 from chemical attack from contaminants in the fuel, such as sulfur and water that would form sulfuric acid and pit the surface of the wall 12. Therefore, as a protective layer, the coating 14 serves as a physical diffusion barrier between the hydrocarbon fuel and the wall 12 by preventing reactions between constituents of the fuel and wall 12.

Finally, as used herein, the phrase "low wettability" is defined to mean a surface that enables a hydrocarbon fluid to rapidly pass over the surface by reducing or eliminating the tendency for hydrogen in the fuel to bond with atoms at the surface of the coating 14. This type of bonding is known as chemisorption (chemical absorption) or hydrogen-bonding, and is very strong. It is the type of bounding which is observed when water wicks up the inside of a silica-glass capillary tube as a result of physical-covalent bonding between oxygen in the silica and hydrogen in the water. A low wettability surface in accordance with this definition evolves only physisorption via weak polar (van der Waals) forces.

According to this invention, coatings having the above-described characteristics serve to prevent or at least considerably reduce the formation, deposition and adhesion of gum, coke and/or other decomposition impurities. A critical requirement for suitable compositions for the coating 14 is the ability to be deposited in such a manner as to obtain a suitable surface smoothness. Formation of a suitable surface finish can be achieved by chemical vapor deposition (CVD). Contrary to the teachings of many others, exemplified by U.S. Pat. No. 4,297,150 to Foster et al., the CVD process of this invention does not entail pre-oxidizing or otherwise roughening the surface of the wall 12 to help anchor the CVD coating to the wall surface, as doing so would increase the surface roughness of the coating 14 beyond that which is acceptable for the invention. It is further preferred that the CVD coating be amorphous (i.e., not crystalline) since grain boundaries in the coating 14 have been identified as preferential sites (atom concentration and crystal structure) for diffusion of metal atoms through the coating 14, which would lead to reactions with sulfur in the fuel that produce metal sulfides on the surface and an increase in surface roughness above that permitted by this invention.

Finally, according to this invention, surface wettability of the coating 14 must be reduced or eliminated. As noted above, surface wettability is generally eliminated or reduced by avoiding or reducing the tendency for hydrogen in the hydrocarbon fluid to bond with atoms at the surface of the coating 14, a process termed chemisorption. In a first embodiment of this invention, a diffusion barrier layer 16 of metal oxides is covered by a surface layer 18 containing metal atoms or metal-metal compounds that exhibit a low affinity for chemisorption. In accordance with this invention, the surface of the wall 12 preferably is essentially oxide-free, i.e., substantially free of oxides formed in situ on the surface by oxidation of the surface, in contradistinction to the metal oxides that are applied to the surface to form the diffusion barrier layer 16. In addition, the protective diffusion barrier layer 16 and the surface layer are preferably deposited by CVD to be smooth. Preferred metals for the surface layer 18 are those that appear on the left side (Group 1A) of the periodic table, namely, lithium, sodium, potassium, rubidium and francium, and compounds thereof. Also suitable are less electropositive metals such as aluminum and gold. These metals and metal-metal compounds thereof exhibit a low affinity for hydrogen, and generally are poor catalysts for petroleum reactions.

A preferred coating 14 for this embodiment is to apply both the diffusion barrier layer 16 and the surface layer 18 by CVD to have a surface roughness of about 16 microinches (about 4 micrometers) $R_a$ or less. Preferred metal oxides for the diffusion barrier layer 16 include amorphous tantala (tantalum oxide) and silica (silicon dioxide) deposited to a thickness of at least about 0.5 micrometers, which effectively inhibits or eliminates diffusion of metal atoms through the coating 14. A preferred composition for the low-wettability surface layer 18 is a substantially pure metal or metal-metal compound deposited to a thickness of at least about 0.5. The overall thickness of the coating 14 (layers 16 and 18 combined) is preferably not greater than about two micrometers to reduce the tendency for spallation due to thermal stress.

According to a second embodiment of this invention, chemisorption is avoided by forming the entire coating 14 or at least a surface region (e.g., layer 18 in FIG. 1) of the coating 14 from a material in which any potentially electronegative atoms in the coating 14 are tied-up with other strong chemical bonds. For example, a coating containing fluorine might include carbon that symmetrically ties-up the fluorine atoms so that hydrogen cannot find a chemisorption anchoring point. A particularly suitable coating 14 includes the diffusion barrier layer 16 disclosed above and a surface layer 18 containing carbon in a "diamond-like" state, whereby carbon atoms are symmetrically tied to each other by covalent bonds, and surface atoms at worst provide double carbon bonds in competition with hydrogen bonding or preexisting carbon-hydrogen bonds in the surface. As with the first embodiment, the coating 14 of this embodiment is preferably deposited by CVD on a smooth, essentially oxide-free surface of the wall 12 in order to yield a sufficiently smooth coating surface.

A preferred diamond-like material for the surface layer 18 is produced by Diamonex, Inc. and disclosed in U.S. Pat. Nos. 5,527,596, 5,508,092 and 5,506,038, the disclosures of which are incorporated herein by reference. Such coating materials have conventionally been used for their combination of optical transparency, hardness, and low friction characteristics, which are found to be particularly useful as optically transparent substrates, such as for glass or clear plastic products. In contrast, the coating materials disclosed in these patents are desirable for achieving the objects of this invention for their low friction characteristics and very low wettability toward hydrocarbon fluids for the reasons disclosed herein, and without regard to the transparency of such materials. Furthermore, these diamond-like coating materials have not been previously considered for use as a coke-barrier coating, nor have their low-wettability characteristic been identified as being desirable for such applications.

While the two embodiments described above are specific examples of coatings within the scope of this invention, other single-layer coatings and multiple-layer coatings are also encompassed by this invention as long as such coatings have a sufficiently smooth surface, provide a barrier to diffusion, and exhibit the desired lack of chemisorption discussed above. Accordingly, while the invention has been described in terms of preferred embodiments, it is apparent that other forms could be adopted by one skilled in the art. Therefore, the scope of the invention is to be limited only by the following claims.

What is claimed is:

1. An article comprising a wall and a coating on the wall, the coating having a smooth surface, the coating protecting the wall from chemical attack by constituents of a hydrocarbon fluid, the coating comprising a surface layer that contains one or more materials that reduce the tendency for hydrogen atoms in the hydrocarbon fluid to covalently bond with atoms in the surface layer, the one or more materials being chosen from the group consisting of metal and metal-metal compounds of aluminum, gold, the Group 1A elements of the periodic table and combinations thereof, diamond-like compounds, and compounds consisting of electronegative atoms tied up with atoms of another element by a chemical bond so that hydrogen atoms in the hydrocarbon fluid cannot find a chemisorption anchoring point on the surface of the coating.

2. The article of claim 1, wherein the element is carbon.

3. The article of claim 1, wherein the one or more materials of the surface layer consist essentially of one or more metals selected from Group 1A of the periodic table.

4. The article of claim 1, wherein the coating further comprises a sublayer beneath the surface layer.

5. The article of claim 4, wherein the sublayer is an amorphous metal oxide layer deposited on an essentially oxide-free surface of the wall.

6. The article of claim 4, wherein the sublayer and the surface layer are deposited by chemical vapor deposition.

7. The article of claim 1, wherein the surface layer consists essentially of electronegative atoms tied up with atoms of the element.

8. The article of claim 1, wherein the surface layer consists essentially of one or more diamond-like carbon compounds.

9. The article of claim 1, wherein the surface layer contains halogen atoms tied up with carbon atoms.

10. The article of claim 1, wherein the surface of the coating is substantially free of fluid recirculation zones as the hydrocarbon fluid flows across the wall, such that surface reaction time and concentration of deposit precursors during fluid flow is reduced.

11. The article of claim 1, wherein the coating has a surface roughness of not greater than about 16 microinches $R_a$, and wherein the coating is applied to a surface of the wall that is essentially oxide-free.

12. An article comprising:
a wall having an essentially oxide-free surface; and
a coating on the wall and contacting a hydrocarbon fluid, the coating having a surface with a surface roughness of not greater than about 16 microinches $R_a$, the coating protecting the wall from chemical attack by constituents in the hydrocarbon fluid, the coating comprising a surface layer that consists essentially of one or more materials that reduce the tendency for hydrogen atoms in the hydrocarbon fluid to covalently bond with atoms in the surface layer, the one or more materials being chosen from the group consisting of diamond-like carbon compounds and metal and metal-metal compounds of aluminum, gold, the Group 1A elements of the periodic table and combinations thereof.

13. The article of claim 12, wherein the surface layer consists of at least one material selected from the group consisting of metal atoms and metal-metal compounds of one or more metals selected from the group consisting of aluminum, gold, and Group 1A of the periodic table.

14. The article of claim 12, wherein the coating further comprises an amorphous metal oxide diffusion barrier layer beneath the surface layer, the surface layer and the diffusion barrier layer being deposited by chemical vapor deposition.

15. The article of claim 12, wherein the surface layer consists essentially of one or more diamond-like carbon compounds.

16. A method for reducing deposition of thermal decomposition products on a wall of an article containing a hydrocarbon fluid, the method comprising the step of depositing a coating on the wall to have a smooth surface, the coating protecting the wall from chemical attack by constituents in the hydrocarbon fluid, the coating comprising a surface layer that contains one or more materials that reduce the tendency for hydrogen atoms in the hydrocarbon fluid to covalently bond with atoms in the surface layer, the one or more materials being chosen from the group consisting of metal and metal-metal compounds of aluminum, gold, the Group 1A elements of the periodic table and combinations thereof, one or more diamond-like compounds, and compounds consisting of electronegative atoms tied up with atoms of another element by a chemical bond so that hydrogen atoms in the hydrocarbon fluid cannot find a chemisorption anchoring point on the surface of the coating.

17. The method of claim 16, wherein the element is carbon.

18. The method of claim 16, wherein the surface layer consists essentially of one or more metals selected from Group 1A of the periodic table.

19. The method of claim 16, wherein the coating further comprises a diffusion barrier layer beneath the surface layer.

20. The method of claim 19, wherein the diffusion barrier layer is an amorphous metal oxide layer deposited on an essentially oxide-free surface of the wall.

21. The method of claim 19, wherein the diffusion barrier layer and the surface layer are deposited by chemical vapor deposition.

22. The method of claim 16, wherein the surface layer consists essentially of electronegative atoms tied up with atoms of the element.

23. The method of claim 16, wherein the surface layer consists essentially of one or more diamond-like carbon compounds.

24. The method of claim 16, wherein the surface layer contains halogen atoms tied up with carbon atoms.

25. The method of claim 16, wherein the coating is deposited to have a surface roughness of not greater than about 16 microinches $R_a$, and the coating is applied to a surface of the wall that is essentially oxide-free.

* * * * *